(12) United States Patent
Huang et al.

(10) Patent No.: US 10,263,156 B2
(45) Date of Patent: Apr. 16, 2019

(54) LIGHT EMITTING DIODE STRUCTURE

(71) Applicant: Genesis Photonics Inc., Tainan (TW)

(72) Inventors: Yi-Ru Huang, Tainan (TW); Yu-Yun Lo, Tainan (TW); Chih-Ling Wu, Tainan (TW); Jing-En Huang, Tainan (TW); Shao-Ying Ting, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 15/871,891

(22) Filed: Jan. 15, 2018

(65) Prior Publication Data
US 2018/0138369 A1  May 17, 2018

Related U.S. Application Data

(63) Continuation of application No. 14/019,553, filed on Sep. 6, 2013, now Pat. No. 9,871,169.

(30) Foreign Application Priority Data

Jul. 17, 2013  (TW) .............................. 102125578 A

(51) Int. Cl.
*H01L 33/40* (2010.01)
*H01L 33/42* (2010.01)

(52) U.S. Cl.
CPC ............ *H01L 33/405* (2013.01); *H01L 33/42* (2013.01)

(58) Field of Classification Search
CPC ......... H01L 33/36; H01L 33/38; H01L 33/40; H01L 33/405; H01L 33/42
See application file for complete search history.

(56) References Cited

U.S. PATENT DOCUMENTS

| 2011/0284822 A1* | 11/2011 | Jung | H01L 33/505 |
| | | | 257/13 |
| 2012/0049219 A1* | 3/2012 | Kamiya | H01L 33/382 |
| | | | 257/98 |
| 2012/0305964 A1* | 12/2012 | Akaike | H01L 33/0079 |
| | | | 257/98 |

FOREIGN PATENT DOCUMENTS

| TW | 201010131 | 3/2010 |
| TW | 201205871 | 2/2012 |
| TW | 201327917 | 7/2013 |

OTHER PUBLICATIONS

"Office Action of Taiwan Counterpart Application," dated Dec. 8, 2017, p. 1-p. 9.

(Continued)

*Primary Examiner* — Mohammed R Alam
(74) *Attorney, Agent, or Firm* — JCIPRNET

(57) ABSTRACT

A light emitting diode structure including a substrate, a semiconductor epitaxial structure, a first insulating layer, a first reflective layer, a second reflective layer, a second insulating layer and at least one electrode. The substrate has a tilt surface. The semiconductor epitaxial structure at least exposes the tilt surface. The first insulating layer exposes a portion of the semiconductor epitaxial structure. The first reflective layer is at least partially disposed on the portion of the semiconductor epitaxial structure and electrically connected to the semiconductor epitaxial structure. The second reflective layer is disposed on the first reflective layer and the first insulating layer, and covers at least the portion of the tilt surface. The second insulating layer is disposed on the second reflective layer. The electrode is disposed on the second reflective layer and electrically connected to the first reflective layer and the semiconductor epitaxial structure.

7 Claims, 3 Drawing Sheets

(56) References Cited

OTHER PUBLICATIONS

"Office Action of Taiwan Counterpart Application", dated Nov. 27, 2018, p. 1-p. 5.

* cited by examiner

LIGHT EMITTING DIODE STRUCTURE

CROSS-REFERENCE TO RELATED APPLICATION

This application is a continuation application of and claims the priority benefit of U.S. application Ser. No. 14/019,553, filed on Sep. 6, 2013, now allowed, which claims the priority benefit of Taiwan application serial no. 102125578, filed on Jul. 17, 2013. The entirety of each of the above-mentioned patent applications is hereby incorporated by reference herein and made a part of specification.

BACKGROUND OF THE INVENTION

Field of the Invention

The invention relates to a semiconductor structure. More particularly, the invention relates to a light emitting diode structure.

Description of Related Art

Generally speaking, when fabricating a light emitting diode wafer, a substrate is usually provided first for an epitaxial structure to be formed on the substrate by using a method of an epitaxial growth. Then, electrodes are arranged on the epitaxial structure to provide electric energy, so as to emitting lights by using photoelectric effects. After that, pluralities of interlacing scribe lines are formed in the epitaxial structure via photolithographic and etching techniques, wherein two adjacent longitudinal scribe lines and two adjacent transverse scribe lines together define a light emitting diode die. Afterwards, grinding and cutting processes are performed to divide the light emitting diode wafer into plural light emitting diode dice, such that a light emitting diode is manufactured.

In order to increase light-emitting efficiency of a light emitting diode, the conventional technique is used to dispose an ohmic contact layer, a reflective layer and a barrier layer in sequence, wherein the ohmic contact layer, the reflective layer and the barrier layer only cover a part of the epitaxial structure. Although the aforesaid method can increase light-emitting efficiency of a light emitting diode, the light-emitting efficiency is no longer up to par. Therefore, how to efficiently increase light-emitting efficiency of a light emitting diode is an issue required to be solved.

SUMMARY OF THE INVENTION

The invention provides a light emitting diode structure, which has excellent light-emitting efficiency.

A light emitting diode structure of the invention includes a substrate, a semiconductor epitaxial layer and a reflective conductive structure layer. The semiconductor epitaxial layer is disposed on the substrate and exposes a portion of the substrate. The reflective conductive structure layer covers a part of the semiconductor epitaxial layer and the portion of the substrate exposed by the semiconductor epitaxial layer.

In an embodiment of the invention, the aforesaid semiconductor epitaxial layer includes a first type semiconductor layer, a light emitting layer and a second type semiconductor layer disposed sequentially on the substrate.

In an embodiment of the invention, the aforesaid reflective conductive structure layer includes a transparent conductive layer, a reflective layer and a barrier layer disposed sequentially.

In an embodiment of the invention, an edge of the aforesaid barrier layer is leveled with an edge of the substrate.

In an embodiment of the invention, the substrate has an upper surface and an annular tilt surface connecting to the upper surface, and the barrier layer extends from the upper surface to cover the annular tilt surface.

In an embodiment of the present invention, the aforesaid substrate has an upper surface and an annular tilt surface connecting to the upper surface. A transparent conductive layer, a reflective layer and a barrier layer extend from the upper surface to cover the annular tilt surface. An edge of the transparent conductive layer, and edge of the reflective layer and an edge of the barrier layer are leveled with an edge of the substrate.

In an embodiment of the invention, the aforesaid substrate has an upper surface and an annular tilt surface connecting to the upper surface. A transparent conductive layer, a reflective layer and a barrier layer extend from the upper surface to cover the annular tilt surface and converge to one same position.

In an embodiment of the invention, a material of the aforesaid transparent conductive layer is selected from one of groups consisting of indium tin oxide, aluminum doped zinc oxide, indium zinc oxide and a combination thereof.

In an embodiment of the invention, a material of the aforesaid reflective layer is selected from one of groups consisting of silver (Ag), chromium (Cr), nickel (Ni), aluminum (Al) and a combination thereof.

In an embodiment of the invention, the aforesaid reflective layer is a distributed Bragg reflector (DBR).

In an embodiment of the invention, a material of the aforesaid barrier layer is selected from one of groups consisting of titanium-tungsten alloy, titanium (Ti), tungsten (W), titanium nitride (TiN), tantalum (Ta), chromium (Cr), chromium-copper alloy, titanium nitride and a combination thereof.

In an embodiment of the invention, the aforesaid light emitting diode structure further includes an insulating layer. The insulating layer is disposed between a substrate and a reflective conductive structure layer, and between a semiconductor epitaxial layer and a reflective conductive structure layer.

In an embodiment of the invention, the aforesaid light emitting diode structure further includes a first electrode, a second electrode, and an interconnecting layer. The semiconductor epitaxial layer has a sunken area, and the sunken area divides the semiconductor epitaxial layer into a first semiconductor block and a second semiconductor block. The first electrode is disposed on the first semiconductor block. The second electrode is disposed on the second semiconductor block. The interconnecting layer is disposed in the sunken area, and is electrically connected the first electrode with the semiconductor epitaxial layer.

In an embodiment of the invention, the aforesaid light emitting diode structure further includes an electrical insulating layer. The electrical insulating layer is at least disposed between the first electrode and the reflective conductive structure layer, and between the interconnecting layer and the reflective conductive structure layer.

In an embodiment of the invention, a material of the aforesaid first electrode is different from a material of an interconnecting layer.

In light of the foregoing, since the light emitting diode structure of the invention has a reflective conductive structure layer, and the reflective conductive structure layer covers a part of the semiconductor epitaxial layer and a portion of the substrate exposed by the semiconductor epitaxial layer, the reflective conductive structure layer is capable of effectively reflecting lights from the semiconductor epitaxial layer, and the portion of the substrate exposed by the semiconductor epitaxial layer also has reflecting effects. Thus, an arrangement of the reflective conductive structure layer can effectively enlarge reflective areas and can further effectively increase light-emitting efficiency of the light emitting diode structure as a whole.

Several exemplary embodiments accompanied with figures are described in detail below to further describe the invention in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the invention.

DESCRIPTION OF EMBODIMENTS

Figure 1:
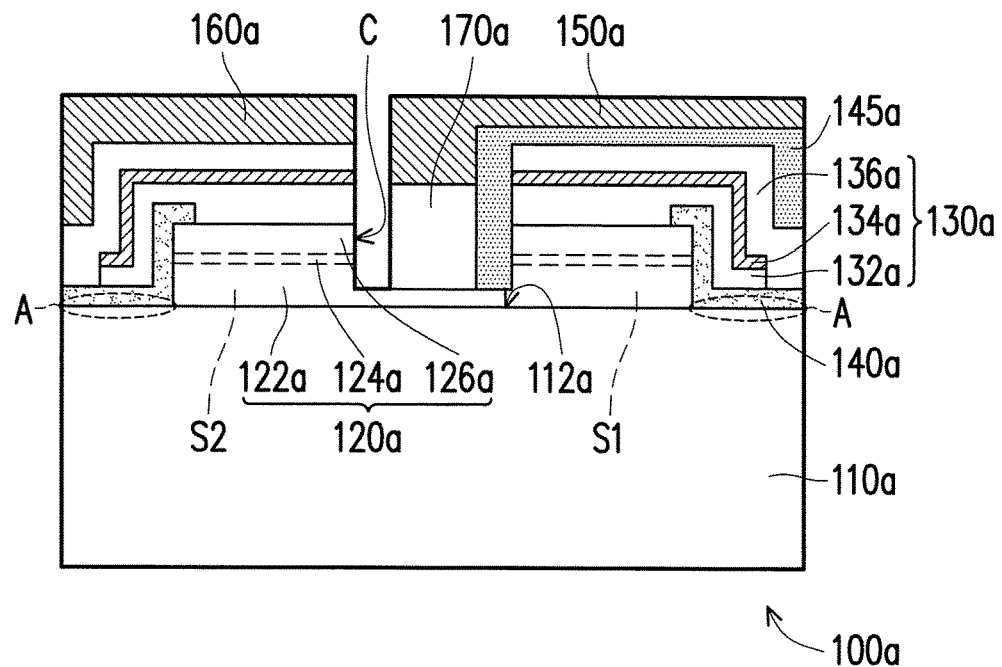
FIG. 1 is a cross-sectional view illustrating a light emitting diode structure according to an embodiment of the invention.

FIG. 1 is a cross-sectional view illustrating a light emitting diode structure according to an embodiment of the invention. Referring to FIG. 1, in the present embodiment, a light emitting diode structure 100a includes a substrate 110a, a semiconductor epitaxial layer 120a and a reflective conductive structure layer 130a. The semiconductor epitaxial layer 120a is disposed on the substrate 110a, and exposes a portion of the substrate 110a (dotted circular lines A as shown in FIG. 1). The reflective conductive structure layer 130a is disposed on the semiconductor epitaxial layer 120a, wherein the reflective conductive structure layer 130a covers a part of the semiconductor epitaxial layer 120a and the portion of the substrate 110a exposed by the semiconductor epitaxial layer 120a.

More specifically, in the present embodiment, the substrate 110a, for example, is a sapphire substrate. However, the invention is not limited thereto. The substrate 110a has an upper surface 112a. The semiconductor epitaxial layer 120a includes a first type semiconductor layer 122a, a light emitting layer 124a and a second type semiconductor layer 126a disposed on the substrate 110 in sequence. Here, the first type semiconductor layer 122a, for example, is an N-type semiconductor layer, while the second type semiconductor layer 126a, for example, is a P-type semiconductor layer. However, the invention is not limited thereto. As shown in FIG. 1, the semiconductor epitaxial layer 120a does not completely cover the upper surface 112a of the substrate 110a. Instead, the semiconductor epitaxial layer 120a exposes a portion of the upper surface 112a of the substrate 110a.

Particularly, the reflective conductive structure layer 130a of the present embodiment is composed of a transparent conductive layer 132a, a reflective layer 134a and a barrier layer 136a disposed in sequence. The transparent conductive layer 132a can be deemed as an ohmic contact layer, and the purpose of the transparent conductive layer 132a is to increase the current conduction and so that the current can be uniformly dispersed. Herein, the transparent conductive layer 132a is disposed on the semiconductor epitaxial layer 120a and cover the upper surface 112a of the substrate 110a exposed by the semiconductor epitaxial layer 120a. Here, a material of the transparent conductive layer 132a is selected from one of groups consisting of indium tin oxide, aluminum doped zinc oxide, indium zinc oxide and a combination thereof. The transparent conductive layer 132a of the present embodiment is composed of indium tin oxide. The reflective layer 134a is disposed on the transparent conductive layer 132a. The reflective layer 134a is capable of reflecting lights from the semiconductor epitaxial layer 120a to the substrate 110a. When the light emitting diode structure 100a of the invention is applied to, for example, a flip-chip light emitting diode, light-emitting efficiency is better improved. Here, a material of the reflective layer 134a is selected from a group consisting of silver (Ag), chromium (Cr), nickel (Ni), aluminum (Al) and a combination thereof. Or, the reflective layer 134a, for example, is a distributed Bragg reflector (DBR). The reflective layer 134a of the present embodiment is composed of silver (Ag). The barrier layer 136a is disposed on the reflective layer 134a, and covers the upper surface 112a of the substrate 110a exposed by the semiconductor epitaxial layer 120a, wherein the barrier layer 136a not only has a reflecting function but also protects a structure of the reflective layer 134a so as to prevent metal in the reflective layer 134a from diffusing. Here, an edge of the barrier layer 136a is leveled with an edge of the substrate 110a, and a material of the barrier layer 136a, for example, is selected from one of groups consisting of titanium-tungsten alloy (TiW), titanium (Ti), tungsten (W), titanium nitride (TiN), tantalum (Ta), chromium (Cr), chromium-copper alloy (CrCu), tantalum nitride (TaN) and a combination thereof. In the present embodiment, the barrier 136a is composed of titanium (Ti), tungsten (W) and titanium-tungsten alloy (TiW).

Moreover, the light emitting diode structure 100a of the present embodiment further includes an insulating layer 140a, wherein the insulating layer 140a is disposed between the substrate 110a and the reflective conductive structure layer 130a and between the semiconductor epitaxial layer 120a and the reflective conductive structure layer 130a, so as to electrically insulating the semiconductor epitaxial layer 120a and the reflective conductive structure layer 130a effectively. As shown in FIG. 1, the insulating layer 140a of the present embodiment is directly disposed on the semiconductor epitaxial layer 120a, and is disposed on the upper surface 112a of the substrate 110a exposed by the semiconductor epitaxial layer 120a by extending along a side wall of the semiconductor epitaxial layer 120a. The transparent conductive layer 132a and the reflective layer 134a above do not completely cover the insulating layer 140a, and the barrier layer 136a extends along a side wall of the transparent conductive layer 132a and a side wall of the reflective layer 134a to cover the insulating layer 140a. Here, an edge of the insulating layer 140a is leveled with an edge of the barrier layer 136a and an edge of the substrate 110a.

In addition, the light emitting diode structure 100a of the present embodiment further includes a first electrode 150a, a second electrode 160a, and an interconnecting layer 170a.

The semiconductor epitaxial layer 120a has a sunken area C, and the sunken area C divides the semiconductor epitaxial layer 120a into a first semiconductor block S1 and a second semiconductor block S2. The first electrode 150a is disposed on the first semiconductor block S1, and the second electrode 160a is disposed on the second semiconductor block S2, wherein the first electrode 150a and the second electrode 160a are electrical and are capable of providing electric energy. The interconnecting layer 170a is disposed in the sunken area C, and is electrically connected the first electrode 150a with the semiconductor epitaxial layer 120a. Here, the first electrode 150a and the interconnecting layer 170a can be fabricated with the same or different materials, preferably with different materials. The material of the first electrode 150a is selected from one of groups consisting of gold (Au), tin (Sn), gold-tin alloy and a combination thereof. The material of the interconnecting layer 170a is selected from one of groups consisting of chromium (Cr), platinum (Pt), gold (Au), aluminum (Al) and alloy of the aforesaid materials as well as a combination thereof. The first electrode 150a and the interconnecting layer 170a can better be electrically connected by using different materials. However, the invention is not limited thereto. Here, the first electrode 150a is electrically connected to the first type semiconductor layer 122a of the semiconductor epitaxial layer 120a through the interconnecting layer 170a, and the second electrode 160a is electrically connected to the second type semiconductor layer 126a of the semiconductor epitaxial layer 120a through the reflective conductive structure layer 130a. The light emitting diode structure 100a illuminates with electric energy provided by the first electrode 150a and the second electrode 160a.

Moreover, the light emitting diode structure 100a further includes an electrical insulating layer 145a, wherein the electrical insulating layer 145a at least is disposed between the first electrode 150a and the reflective conductive structure layer 130a, and between the interconnecting layer 170a and the reflective conductive structure layer 130a and is configured for electrically insulating the reflective conductive structure layer 130a, the interconnecting layer 170a and the first electrode 150a. Here, an edge of the electrical insulating layer 145a is also leveled with the edge of the barrier layer 136a, the edge of the insulating layer 140 and the edge of the substrate 110a.

Since the light emitting diode structure 100a of the present embodiment has the reflective conductive structure layer 130a, and the reflective conductive structure layer 130a covers a part of the semiconductor epitaxial layer 120a and the portion of the substrate 110a exposed by the semiconductor epitaxial layer 120a, the reflective conductive structure layer 130a is capable of effectively reflecting lights from the semiconductor epitaxial layer 120a, and allows the portion of the substrate 110a exposed by the semiconductor epitaxial layer 120a to also has reflecting effects. Thus, when the light emitting diode structure 100a is applied to, for example, a design with a flip-chip, an arrangement of the reflective conductive structure layer 130a can effectively enlarge reflective areas and can effectively increase light-emitting efficiency of the light emitting diode structure 100a as a whole.

It has to be noted that, the following embodiment uses the reference numerals and parts of the contents of the aforesaid embodiment, wherein same reference numerals are adopted to represent the same or similar elements, and repetitive explanations of the same technical content is omitted. Concerning the omitted illustration, please refer to the aforesaid embodiment. The same technical contents are not repeated in the following embodiment.

Figure 2:
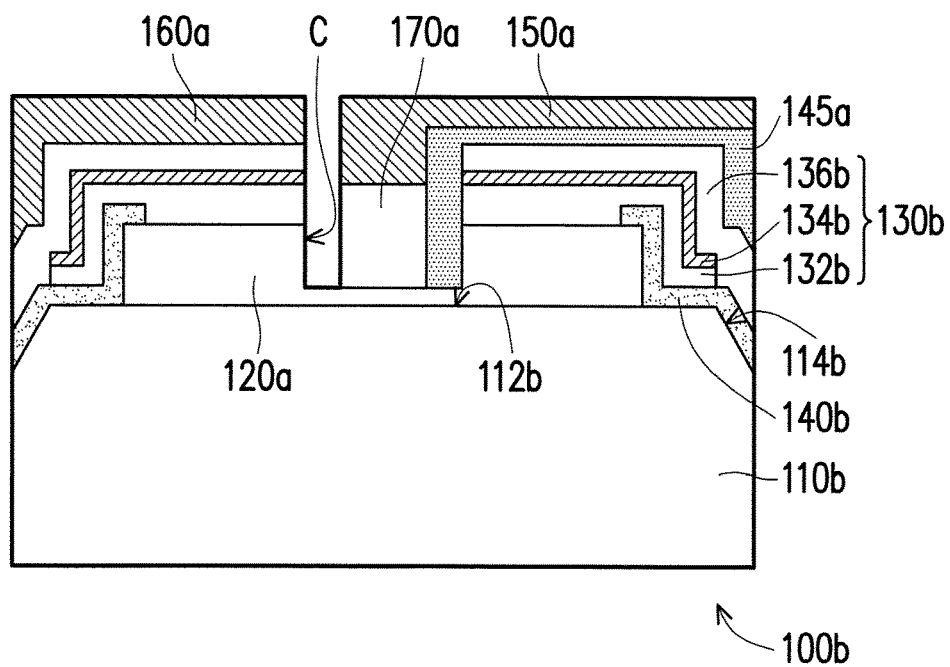
FIG. 2 is a cross-sectional view illustrating a light emitting diode structure according to another embodiment of the invention.

FIG. 2 is a cross-sectional view illustrating a light emitting diode structure according to another embodiment of the invention. Referring to FIG. 2. A light emitting diode structure 100b of the present embodiment is similar to the light emitting diode structure 100a of FIG. 1. However, a discrepancy lies in that: a substrate 110b of the present embodiment has an upper surface 112b and an annular tilt surface 114b connecting to the upper surface 112b, wherein an insulating layer 140b and a barrier layer 136b extend from the upper surface 112b to cover the annular tilt surface 114b. As shown in FIG. 2, a transparent conductive layer 132b and the reflective layer 134b of a reflective conductive structure layer 130b do not extend to cover the annular tilt surface 114b.

Figure 3:
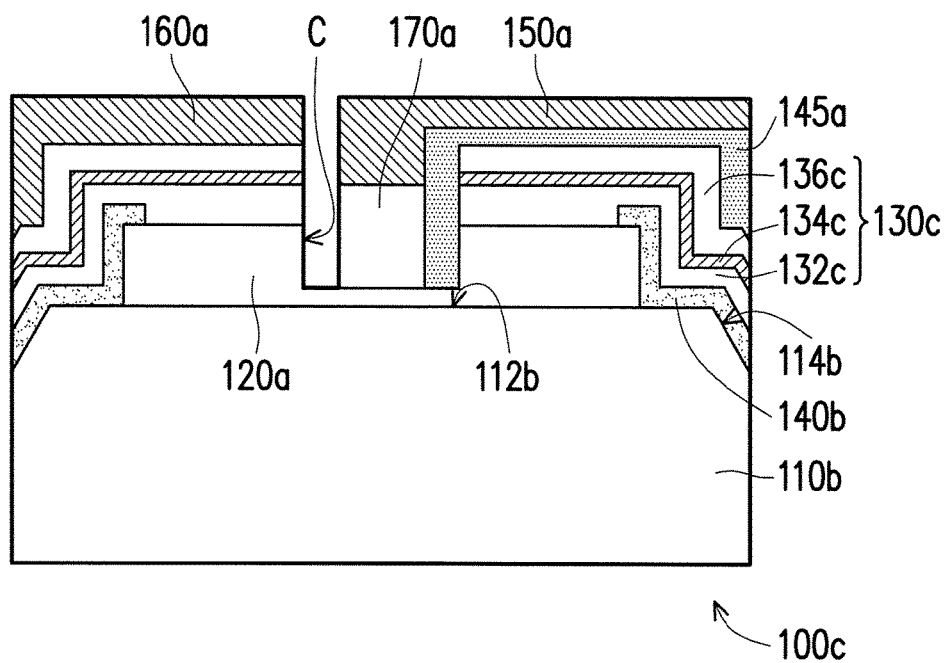
FIG. 3 is a cross-sectional view illustrating a light emitting diode structure according to another embodiment of the invention.

FIG. 3 is a cross-sectional view illustrating a light emitting diode structure according to another embodiment of the invention. Referring to FIG. 3. A light emitting diode structure 100c of the present embodiment is similar to the light emitting diode structure 100b of FIG. 2. However, a discrepancy lies in that: a transparent conductive layer 132c, a reflective layer 134c and a barrier layer 136c of a reflective conductive structure layer 130c extend from the upper surface 112b to cover the annular tilt surface 114b, and an edge of the transparent conductive layer 132c, an edge of the reflective layer 134c and an edge of the barrier layer 136c are leveled with an edge of the substrate 110b. It is designed for the reflective conductive layer 130c not only to be disposed on the upper surface 112b of the substrate 110b, but also to extend for covering the annular tilt surface 114b so as to enlarge reflective areas.

Figure 4:
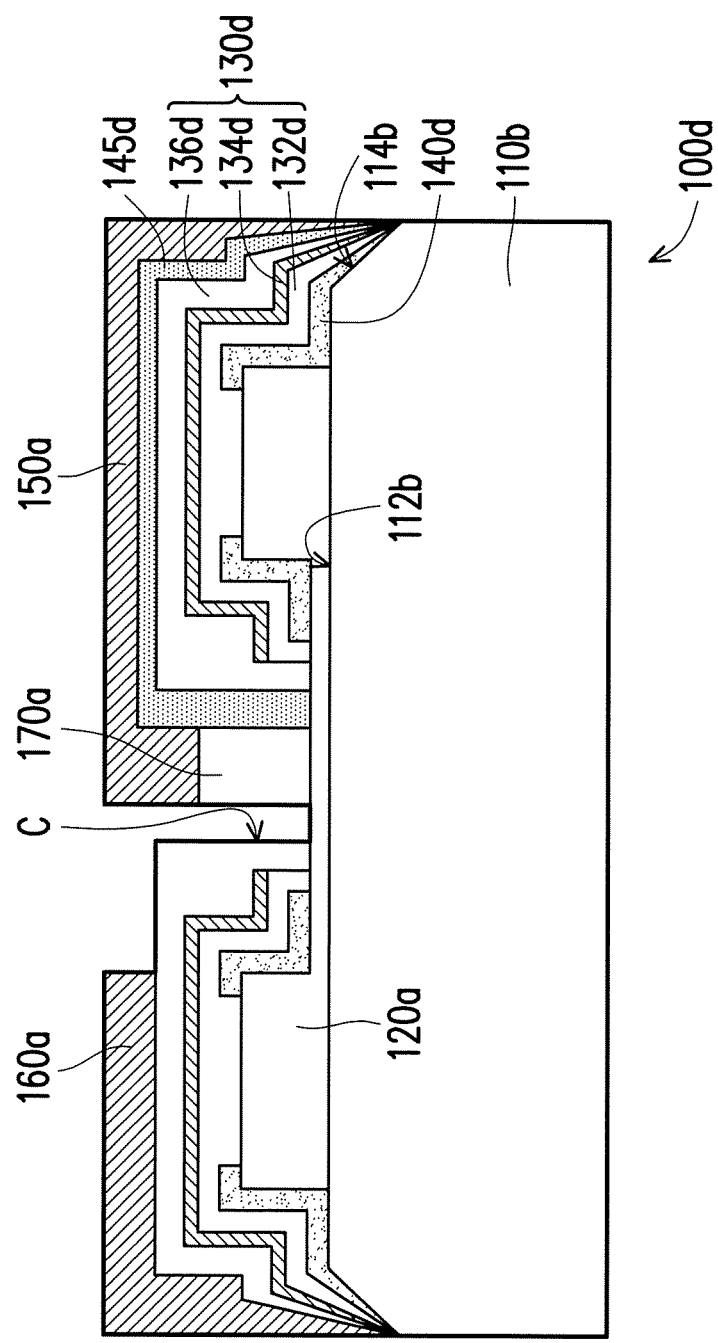
FIG. 4 is a cross-sectional view illustrating a light emitting diode structure according to another embodiment of the invention.

FIG. 4 is a cross-sectional view illustrating a light emitting diode structure according to another embodiment of the invention. Referring to FIG. 4. A light emitting diode structure 100d of the present embodiment is similar to the light emitting diode structure 100b of FIG. 2. However, a discrepancy lies in that: a transparent conductive layer 132d, a reflective layer 134d and a barrier layer 136d of a reflective conductive structure layer 130d, as well as an insulating layer 140d and an electrical insulating layer 145d all extend from the upper surface 112b to cover the annular tilt surface 114b and converge to one same position.

In conclusion, since the light emitting diode structure of the invention has the reflective conductive structure layer, and the reflective conductive structure layer covers the part of the semiconductor epitaxial layer and the portion of the substrate exposed by the semiconductor epitaxial layer, the reflective conductive structure layer is capable of effectively reflecting lights from the semiconductor epitaxial layer, and the portion of the substrate exposed by the semiconductor epitaxial layer also has reflecting effects. Thus, the arrangement of the reflective conductive structure layer can effectively enlarge reflective areas and can further effectively increase light-emitting efficiency of the light emitting diode structure as a whole.

It will be apparent to those skilled in the art that various modifications and variations can be made to the structure of the disclosed embodiments without departing from the scope or spirit of the invention. In view of the foregoing, it is intended that the disclosure cover modifications and variations of this specification provided they fall within the scope of the following claims and their equivalents.

What is claimed is:

1. A light emitting diode structure, comprising: a substrate having a tilt surface; a semiconductor epitaxial structure disposed on the substrate and at least exposing the tilt surface of the substrate, wherein the semiconductor epitaxial structure comprises a first type semiconductor layer, a second type semiconductor layer and a light emitting layer disposed therebetween; a first insulating layer covering an entire side surface of the semiconductor epitaxial structure and at least a portion of the tilt surface of the substrate, and exposing a portion of an upper surface of the semiconductor epitaxial structure; a conductive layer at least partially disposed on the exposed portion of the upper surface of the semiconductor epitaxial structure and electrically connected to the semiconductor epitaxial structure; a second insulating layer disposed over the conductive layer and the first insulating layer; a first reflective layer disposed directly on the conductive layer and between the first insulating layer and the second insulating layer, and covering at least the portion of the tilt surface of the substrate; a second reflective layer disposed between the first reflective layer and the second insulating layer; and at least one electrode disposed over the second reflective layer and electrically connected to the conductive layer and the semiconductor epitaxial structure.

2. The light emitting diode structure as claimed in claim 1, wherein the first reflective layer is a metal reflective layer or a distributed Bragg reflector (DBR).

3. The light emitting diode structure as claimed in claim 1, wherein the second insulating layer further covers at least the portion of the tilt surface of the substrate.

4. A light emitting diode structure, comprising: a substrate having an upper surface; a semiconductor epitaxial structure disposed on the upper surface of the substrate and exposing a portion of the upper surface of the substrate, wherein the semiconductor epitaxial structure comprises a first type semiconductor layer, a second type semiconductor layer and a light emitting layer disposed therebetween; a first insulating layer covering an entire side surface of the semiconductor epitaxial structure and the portion of the upper surface of the substrate, and exposing a portion of an upper surface of the semiconductor epitaxial structure; a conductive layer at least partially disposed on the exposed portion of the upper surface of the semiconductor epitaxial structure and electrically connected to the semiconductor epitaxial structure; a second insulating layer disposed on the conductive layer and the first insulating layer; a distributed Bragg reflector layer disposed between the first insulating layer and the second insulating layer, wherein the portion of the upper surface of the substrate is at least partially covered by the distributed Bragg reflector layer; a metal layer disposed between the distributed Bragg reflector layer and the second insulating layer and covering at least a portion of the distributed Bragg reflector layer; and at least one electrode disposed on the distributed Bragg reflector layer, and electrically connected to the conductive layer and the semiconductor epitaxial structure through the metal layer, wherein the light emitting diode structure has a flat side surface, and the flat side surface comprises the substrate, the first insulating layer and the second insulating layer.

5. The light emitting diode structure as claimed in claim 4, wherein the flat side surface further comprises the distributed Bragg reflector layer.

6. A light emitting diode structure, comprising: a substrate having an upper surface; a semiconductor epitaxial structure disposed on the upper surface of the substrate and exposing a portion of the upper surface of the substrate, wherein the semiconductor epitaxial structure comprises a first type semiconductor layer, a second type semiconductor layer and a light emitting layer disposed therebetween; a first insulating layer covering the semiconductor epitaxial structure and the portion of the upper surface of the substrate, wherein a first opening and a second opening are formed therein to expose a portion of the semiconductor epitaxial structure respectively; an interconnecting layer at least partially disposed in the first opening of the first insulating layer and electrically connected to the first type semiconductor layer of the semiconductor epitaxial structure; a conductive layer at least partially disposed in the second opening of the first insulating layer and electrically connected to the second type semiconductor layer of the semiconductor epitaxial structure; a distributed Bragg reflector layer at least partially disposed on the conductive layer and the first insulating layer, wherein the portion of the upper surface of the substrate is at least partially covered by the distributed Bragg reflector layer; a second insulating layer disposed on the distributed Bragg reflector layer; a metal layer disposed between the distributed Bragg reflector layer and the second insulating layer and covering at least a portion of the distributed Bragg reflector layer; a first electrode disposed on the first insulating layer, the second insulating layer and the distributed Bragg reflector layer, and the first electrode being electrically connected to the interconnecting layer and the semiconductor epitaxial structure via the first opening; and a second electrode disposed on the first insulating layer and the distributed Bragg reflector layer, and the second electrode being electrically connected to the metal layer, the conductive layer and the semiconductor epitaxial structure via the second opening, wherein the light emitting diode structure has a flat side surface, and the flat side surface comprises the substrate, the first insulating layer and the second insulating layer.

7. The light emitting diode structure as claimed in claim 6, wherein the flat side surface further comprises the distributed Bragg reflector layer.

* * * * *